US012677618B2

(12) United States Patent
Narita et al.

(10) Patent No.: US 12,677,618 B2
(45) Date of Patent: Jul. 7, 2026

(54) COMPOSITION AND METHOD FOR TREATING SUBSTRATE

(71) Applicant: FUJIFILM Corporation, Tokyo (JP)

(72) Inventors: Moe Narita, Shizuoka (JP); Nobuaki Sugimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 396 days.

(21) Appl. No.: 18/174,208

(22) Filed: Feb. 24, 2023

(65) Prior Publication Data

US 2023/0223272 A1 Jul. 13, 2023

Related U.S. Application Data

(63) Continuation of application No. PCT/JP2021/031941, filed on Aug. 31, 2021.

(30) Foreign Application Priority Data

Sep. 3, 2020 (JP) ................................. 2020-148417

(51) Int. Cl.
*H10P 50/66* (2026.01)

(52) U.S. Cl.
CPC ................................. *H10P 50/667* (2026.01)

(58) Field of Classification Search
None
See application file for complete search history.

(56) References Cited

U.S. PATENT DOCUMENTS

2001/0049067 A1* 12/2001 Mitsumori ........... G03G 5/0546
430/96
2007/0179231 A1* 8/2007 Sonobe .................... C08K 5/09
524/425

(Continued)

FOREIGN PATENT DOCUMENTS

WO 2019/142788 A1 7/2019
WO 2020/049955 A1 3/2020
WO 2020/166677 A1 8/2020

OTHER PUBLICATIONS

International Search Report dated Nov. 30, 2021 issued in International Application No. PCT/JP2021/031941.

(Continued)

*Primary Examiner* — Allan W. Olsen
(74) *Attorney, Agent, or Firm* — Sughrue Mion, PLLC

(57) ABSTRACT

The present invention provides a composition having an excellent dissolving ability for a transition metal-containing substance and a method for treating a substrate. The composition according to an embodiment of the present invention contains at least one oxohalogen acid compound selected from the group consisting of hypochlorous acid, chlorous acid, chloric acid, bromic acid, and salts thereof and a compound represented by Formula (1), in which a content of the compound represented by Formula (1) is 1.0% to 25.0% by mass with respect to a total mass of the composition.

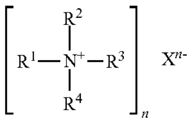

(1)

13 Claims, 2 Drawing Sheets

(56) References Cited

U.S. PATENT DOCUMENTS

| | | | | |
|---|---|---|---|---|
| 2008/0226357 | A1* | 9/2008 | Sano | G03G 15/0818 399/286 |
| 2015/0034882 | A1* | 2/2015 | Inagaki | H01B 1/24 252/511 |
| 2021/0062115 | A1 | 3/2021 | Shimoda et al. | |
| 2021/0189235 | A1 | 6/2021 | Sugimura et al. | |
| 2022/0073820 | A1 | 3/2022 | Kikkawa et al. | |
| 2024/0067878 | A1* | 2/2024 | Hitomi | C09K 13/04 |

OTHER PUBLICATIONS

Written Opinion dated Nov. 30, 2021 issued in International Application No. PCT/JP2021/031941.
International Preliminary Report on Patentability dated Mar. 7, 2023 with a Translation of the Written Opinion of the International Searching Authority in Application No. PCT/JP2021/031941.
Japanese Office Action issued Apr. 23, 2024 in Application No. 2022-546925.
Office Action issued Sep. 25, 2025 in Korean Patent Application No. 10-2023-7006900.
Communication dated Jan. 23, 2025 in Korean Application No. 10-2023-7006900.
Office Action dated Jul. 2, 2025 in Taiwanese Application No. 110132662.
Office Action dated Mar. 2, 2026 in Taiwanese Application No. 110132662.

* cited by examiner

COMPOSITION AND METHOD FOR TREATING SUBSTRATE

CROSS-REFERENCE TO RELATED APPLICATIONS

This application is a Continuation of PCT International Application No. PCT/JP2021/031941 filed on Aug. 31, 2021, which claims priority under 35 U.S.C. § 119(a) to Japanese Patent Application No. 2020-148417 filed on Sep. 3, 2020. The above applications are hereby expressly incorporated by reference, in their entirety, into the present application.

BACKGROUND OF THE INVENTION

1. Field of the Invention

The present invention relates to a composition and a method for treating a substrate.

2. Description of the Related Art

With the miniaturization of semiconductor products, it is increasingly required that a step of removing unnecessary transition metal-containing substances on a substrate in a semiconductor product manufacturing process be performed with high efficiency and high accuracy.

Generally, it is widely known that etching or a method of removing foreign substances having adhered to a solid surface is performed using a composition (etchant) dissolving unnecessary transition metal-containing substances in a step of removing unnecessary transition metal-containing substances on a substrate.

For example, WO2020/049955A discloses a treatment liquid containing hypochlorous acids and a predetermined amount of a quaternary ammonium salt.

SUMMARY OF THE INVENTION

In recent years, it has been required that a further enhanced dissolving ability be exhibited to an unnecessary transition metal-containing substance (particularly, a ruthenium-containing substance (Ru-containing substance)) in a composition in a case where the unnecessary transition metal-containing substance on a substrate is removed.

As a result of examining a transition metal-containing substance (particularly, a Ru-containing substance) by using the composition disclosed in WO2020/049955A, the inventors of the present invention have found that the composition exhibits an insufficient dissolving ability to the transition metal-containing substance (particularly, a Ru-containing substance) and has a room for further improvement of the dissolving ability.

Therefore, an object of the present invention is to provide a composition having excellent dissolving ability for a transition metal-containing substance (particularly, a Ru-containing substance).

Another object of the present invention is to provide a method for treating a substrate by using the composition.

In order to achieve the above object, the inventors of the present invention carried out intensive studies. As a result, the inventors have found that the objects can be achieved by the following constitution.

[1] A composition containing at least one oxohalogen acid compound selected from the group consisting of hypochlorous acid, chlorous acid, chloric acid, bromic acid, and salts thereof and a compound represented by Formula (1) that will be described later, in which a content of the compound represented by Formula (1) is 1.0% to 25.0% by mass with respect to a total mass of the composition.

[2] The composition described in [1], further containing a chloride ion.

[3] The composition described in [2], in which a content of the chloride ion is 0.001% to 1.00% by mass with respect to the total mass of the composition.

[4] The composition described in [2] or [3], in which a mass ratio of the content of the compound represented by Formula (1) to the content of the chloride ion is 100 or less.

[5] The composition described in any one of [1] to [4], in which the number of carbon atoms in an alkyl group is 1 to 10.

[6] The composition described in any one of [1] to [5], in which the total number of carbon atoms in $R^1$ to $R^4$ in Formula (1) is 4 to 15.

[7] The composition described in any one of [1] to [6], in which $R^1$ to $R^4$ each represent an alkyl group selected from the group consisting of an alkyl group having one carbon atom which may have a substituent and an alkyl group having two carbon atoms which may have a substituent, at least one of $R^1$, $R^2$, $R^3$, or $R^4$ is an alkyl group having one carbon atom which may have a substituent, and at least one of $R^1$, $R^2$, $R^3$, or $R^4$ is an alkyl group having two carbon atoms which may have a substituent.

[8] The composition described in any one of [1] to [6], in which the compound represented by Formula (1) includes at least one compound selected from the group consisting of an ethyltrimethylammonium salt, a diethyldimethylammonium salt, a methyltriethylammonium salt, a trimethyl(hydroxyethyl)ammonium salt, a dimethylbis(2-hydroxyethyl)ammonium salt, a methyltris(2-hydroxyethyl)ammonium salt, a methyltributylammonium salt, a dimethyldipropylammonium salt, a benzyltrimethylammonium salt, a benzyltriethylammonium salt, and a triethyl(hydroxyethyl)ammonium salt.

[9] The composition described in any one of [1] to [8], in which n in Formula (1) is 1.

[10] The composition described in any one of [1] to [9], in which $X^{n-}$ in Formula (1) is a hydroxide ion, a chloride ion, a fluoride ion, or a bromide ion.

[11] The composition described in any one of [1] to [10], in which a content of the oxohalogen acid compound is 0.05% to 28.0% by mass with respect to the total mass of the composition.

[12] The composition described in any one of [1] to [11], in which a pH of the composition is 4.0 to 14.0.

[13] The composition described in any one of [1] to [12], in which a pH of the composition is 7.0 to 12.0.

[14] The composition described in any one of [1] to [13], in which the composition is used for removing a ruthenium-containing substance on a substrate.

[15] A method for treating a substrate, including a step A of removing a ruthenium-containing substance on a substrate by using the composition described in any one of [1] to [14].

[16] The method for treating a substrate described in [15], in which the step A is a step A1 of performing a recess etching treatment on a wiring line which is disposed on a substrate and consists of a ruthenium-containing substance by using the composition, a step A2 of removing a film at an outer edge portion of a substrate, on which a film consisting of a ruthenium-containing substance is disposed, by using the composition, a step A3 of removing a metal-containing substance attached to a back surface of a substrate, on which a film consisting of a ruthenium-containing substance is disposed, by using the composition, a step A4 of removing a ruthenium-containing substance on a substrate, which has undergone dry etching, by using the composition, or a step A5 of removing a ruthenium-containing substance on a substrate, which has undergone a chemical mechanical polishing treatment, by using the composition.

According to the present invention, it is possible to provide a composition having an excellent dissolving ability for a transition metal-containing substance (particularly, a Ru-containing substance).

Furthermore, according to an embodiment of the present invention, it is possible to provide a method for treating a substrate by using the composition.

DESCRIPTION OF THE PREFERRED EMBODIMENTS

Figure 1:
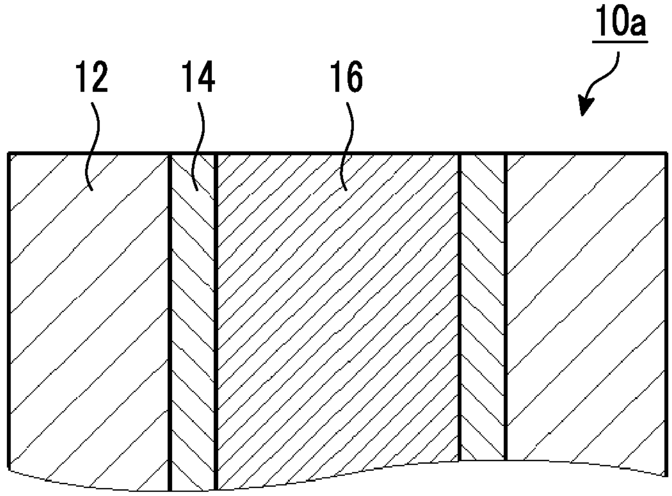
FIG. 1 is a schematic cross-sectional top view showing an example of an object to be treated used in a step A1.

Hereinafter, the present invention will be specifically described.

The following configuration requirements will be described based on typical embodiments of the present invention, but the present invention is not limited to the embodiments.

In the present specification, a range of numerical values described using “to” means a range including numerical values listed before and after “to” as a lower limit and an upper limit.

In the present specification, in a case where there are two or more kinds of components corresponding to a certain component, “content” of such a component means the total content of the two or more kinds of components.

In the present specification, “exposure” is not particularly limited, and includes exposure using a mercury lamp, far ultraviolet rays represented by an excimer laser, X-rays, Extreme Ultraviolet (EUV) light, and the like and drawing by particle beams such as electron beams and ion beams.

Unless otherwise specified, a compound described in the present specification may include structural isomers (compounds having the same number of atoms and different structures), optical isomers, and isotopes. In addition, a compound may include one kind of isomer and isotope or two or more kinds of isomers and isotopes.

In the present specification, a dry etching residue is a by-product generated as a result of performing dry etching (for example, plasma etching). For example, the dry etching residue refers to an organic residue derived from a photoresist, a Si-containing residue, and a metal-containing residue (for example, a transition metal-containing residue).

[Composition]

The composition according to an embodiment of the present invention contains at least one oxohalogen acid compound selected from the group consisting of hypochlorous acid, chlorous acid, chloric acid, bromic acid, and salts of these (hereinafter, also simply called “oxohalogen acid compound”) and a compound represented by Formula (1) (hereinafter, also called “specific compound”), in which a content of the compound represented by Formula (1) is 1.0% to 25.0% by mass with respect to a total mass of the composition.

The mechanism through which the objects of the present invention are achieved by the use of the composition according to the embodiment of the present invention is unclear. According to the inventors of the present invention, the mechanism is assumed to be as below.

Presumably, because the composition contains the oxohalogen acid compound and a predetermined amount of the specific compound, the compounds may bring about a synergistic effect, which can realize an excellent dissolving ability for a transition metal-containing substance (particularly, a Ru-containing substance).

Hereinafter, further improving the dissolving ability of the composition for a transition metal-containing substance (particularly, a Ru-containing substance) will be also described as further improving the effect of the present invention.

<Oxohalogen Acid Compound>

The composition contains an oxohalogen acid compound.

The oxohalogen acid compound means at least one compound selected from the group consisting of hypochlorous acid, chlorous acid, chloric acid, bromic acid, and salts of these.

Examples of the salt of any of hypochlorous acid, chlorous acid, chloric acid, and bromic acid include salts of alkali metal elements (such as sodium and potassium), salts of alkaline earth metal elements (such as magnesium and calcium), salts of other metal elements, and quaternary ammonium salts. Among these, salts of alkali metal elements are preferable, and a sodium salt is more preferable.

As the oxohalogen acid compound, in view of improving the effect of the present invention, at least one compound selected from the group consisting of hypochlorous acid, chlorous acid, and salts of these is preferable, and at least one compound selected from the group consisting of hypochlorous acid and a salt thereof is more preferable.

One kind of oxohalogen acid compound may be used alone, or two or more kinds of oxohalogen acid compounds may be used in combination.

In view of further improving the effect of the present invention, the content of the oxohalogen acid compound with respect to the total mass of the composition is 0.001% to 50.0% by mass in many cases, preferably 0.01% to 30.0% by mass, more preferably 0.05% to 30.0% by mass, even more preferably 0.05% to 28.0% by mass, particularly preferably 0.5% to 28.0% by mass, and most preferably 1.0% to 10.0% by mass.

<Compound Represented by Formula (1)>

The composition contains a compound represented by Formula (1) (specific compound).

The content of the specific compound with respect to the total mass of the composition is 1.0% to 25.0% by mass, preferably 3.0% to 25.0% by mass, more preferably 1.0% to 10.0% by mass, and even more preferably 3.0% to 10.0% by mass.

(1)

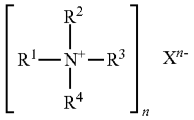

In Formula (1), $R^1$ to $R^4$ each independently represent an alkyl group which may have a substituent.

The alkyl group may be linear, branched, or cyclic, and is preferably linear.

In view of further improving the effect of the present invention, the number of carbon atoms in the alkyl group is preferably 1 to 20, more preferably 1 to 15, even more preferably 1 to 10, particularly preferably 1 to 5, and most preferably 1 or 2.

In view of further improving the effect of the present invention, the total number of carbon atoms in $R^1$ to $R^4$ is preferably 4 to 20, more preferably 4 to 15, and even more preferably 4 to 7. The total number of carbon atoms in $R^1$ to $R^4$ means the sum of carbon atoms in $R^1$, $R^2$, $R^3$, and $R^4$.

Examples of the substituent that the alkyl group has include a hydroxy group, a carboxy group, an amino group, an oxo group, a phosphonic acid group, a sulfo group, an aryl group, a heteroaryl group, and a mercapto group. As the substituent, among these, a hydroxy group or an aryl group is preferable.

The number of substituents that the alkyl group has is preferably 0 to 5, more preferably 0 to 3, and even more preferably 0 or 1.

n represents an integer of 1 to 3.

n is preferably an integer of 1 or 2, and more preferably 1.

$R^1$ to $R^4$ do not represent the same group all together. For example, in a case where all of $R^1$ to $R^4$ represent a methyl group, because $R^1$ to $R^4$ are the same group, the condition of "$R^1$ to $R^4$ do not represent the same group all together" is not satisfied. On the other hand, in a case where all of $R^1$ to $R^3$ are methyl groups and $R^4$ is an ethyl group, because not all $R^1$ to $R^4$ are the same group, the condition of "$R^1$ to $R^4$ do not represent the same group all together" is satisfied. Note that in a case where at least either the type of substituent or the type of alkyl group is different, the groups are not the same group. That is, in a case where two groups differ from each other in terms of at least the type of substituent or the type of alkyl group, the groups are regarded as different groups. For example, because there is a difference in overall structure between an ethyl group and a hydroxyethyl group, these groups are not the same group.

The aforementioned "$R^1$ to $R^4$ do not represent the same group all together" in other words means that 4 groups represented by $R^1$ to $R^4$ represent at least two kinds of groups. For example, in a case where all of $R^1$ to $R^3$ are methyl groups and $R^4$ is an ethyl group, 4 groups represented by $R^1$ to $R^4$ represent two types of groups, a methyl group and an ethyl group.

Examples of aspects that $R^1$ to $R^4$ can take include an aspect in which among the 4 groups represented by $R^1$ to $R^4$, 3 groups represented by $R^1$ to $R^3$ are the same group and 1 group represented by $R^4$ is a group different from the above 3 groups. The examples also include an aspect in which among 4 groups represented by $R^1$ to $R^4$, 2 groups represented by $R^1$ and $R^2$ are the same group and 2 groups represented by $R^3$ and $R^4$ are the same group, but the group represented by $R^1$ and $R^2$ is different from the group represented by $R^3$ and $R^4$. In addition, all of 4 groups represented by $R^1$ to $R^4$ may be different groups.

$R^1$ to $R^4$ are preferably an alkyl group selected from the group consisting of an alkyl group having one carbon atom which may have a substituent and an alkyl group having two carbon atoms which may have a substituent, at least one of $R^1$, $R^2$, $R^3$, or $R^4$ is preferably an alkyl group having one carbon atom which may have a substituent, and at least one of $R^1$, $R^2$, $R^3$, or $R^4$ is preferably an alkyl group having two carbon atoms which may have a substituent.

Examples of $R^1$ to $R^4$ include an alkyl group such as a methyl group, an ethyl group, a propyl group, a butyl group, a dodecyl group, or a tetradodecyl group; a hydroxyalkyl group (an alkyl group having a hydroxy group) such as a hydroxymethyl group, a hydroxyethyl group, or a hydroxybutyl group; and an arylalkyl group (an alkyl group having an aryl group) such as a benzyl group or phenethyl group.

As $R^1$ to $R^4$, among the above, in view of further improving the effect of the present invention, an alkyl group, a hydroxyalkyl group, or an arylalkyl group is preferable, and an alkyl group or a hydroxyalkyl group is more preferable.

$X^{n-}$ represents an n-valent anion.

n has the same definition as n described above, and the suitable aspects thereof are also the same.

The n-valent anion is not particularly limited, and examples thereof include a hydroxide ion, a halide ion, a cyanide ion, an acetate ion, a trifluoroacetate ion, a hydrogen sulfate ion, a sulfate ion, a sulfite ion, a sulfonate ion, a thiosulfate ion, a carbonate ion, an oxalate ion, a hydrogen phosphate ion, and a phosphate ion.

As $X^{n-}$, among the above, in view of further improving the effect of the present invention, a hydroxide ion or a halide ion is preferable, a hydroxide ion, a chloride ion, a fluoride ion, or a bromide ion is more preferable, and a hydroxide ion or a chloride ion is even more preferable.

Examples of the specific compound include an ethyltrimethylammonium salt, a diethyldimethylammonium salt, a methyltriethylammonium salt, a trimethyl(hydroxyethyl) ammonium salt, a methyltributylammonium salt, a dimethyldipropylammonium salt, a benzyltrimethylammonium salt, a benzyltriethylammonium salt, a triethyl(hydroxyethyl)ammonium salt, a dodecyltrimethylammonium salt, a tetradecyltrimethylammonium salt, a hexadecyltrimethylammonium salt, a methyltri(hydroxyethyl)ammonium salt, a benzyltrimethylammonium salt, a triethyl(hydroxyethyl) ammonium salt, a bishydroxyethyldimethylammonium salt, a trimethylpropylammonium salt, an isopropyltrimethylammonium salt, a butyltrimethylammonium salt, a triethylpropylammonium salt, an isopropyltriethylammonium salt, a butyltriethylammonium salt, a methyltripropylammonium salt, an ethyltripropylammonium salt, a butyltripropylammonium salt, an ethyltributylammonium salt, a propyltributylammonium salt, a diisopropyldimethylammonium salt, a dibutyldimethylammonium salt, a diethyldipropylammonium salt, a diethyldiisopropylammonium salt, a diethyldibutylammonium salt, an ethylmethylpropylbutylammonium salt, an ethylmethylisopropylbutylammonium salt, an ethylmethyldipropylammonium salt, an ethylmethyldiisopropylammonium salt, a dimethylbis(2-hydroxyethyl)ammonium salt, a methyltris(2-hydroxyethyl)ammonium salt, and an ethylmethyldibutylammonium salt.

Particularly, the specific compound preferably includes at least one compound selected from the group consisting of an ethyltrimethylammonium salt, a diethyldimethylammonium salt, a methyltriethylammonium salt, a trimethyl(hydroxyethyl) ammonium salt, a dimethylbis(2-hydroxyethyl) ammonium salt, a methyltris(2-hydroxyethyl) ammonium salt, a methyltributylammonium salt, a dimethyldipropylammonium salt, a benzyltrimethylammonium salt, a benzyltriethylammonium salt, and a triethyl(hydroxyethyl)ammonium salt, more preferably includes at least one compound selected from the group consisting of an ethyltrimethylammonium salt, a diethyldimethylammonium salt, a methyltriethylammonium salt, a trimethyl(hydroxyethyl)ammonium salt, a dimethylbis(2-hydroxyethyl)ammonium salt, and a methyltris(2-hydroxyethyl)ammonium salt, and even more preferably includes at least one compound selected from the group consisting of an ethyltrimethylammonium salt, a diethyldimethylammonium salt, a methyltriethylammonium salt, and a trimethyl(hydroxyethyl)ammonium salt.

Examples of the above salts include a salt with $X^{n-}$ described above.

One kind of specific compound may be used alone, or two or more kinds of specific compounds may be used in combination.

<Optional Components>

The composition may contain optional components in addition to the aforementioned components contained in the composition.

Examples of the optional components include a chloride ion, a solvent, a pH adjuster, and a surfactant.

Hereinafter, the optional components will be described.

(Chloride Ion)

The composition may contain a chloride ion.

In a case where the composition contains a chloride ion, a metal residue removability of the composition can be improved.

In view of improving the metal residue removability, the content of the chloride ion with respect to the total mass of the composition is preferably 0.0001% to 20.00% by mass, more preferably 0.0001% to 10.00% by mass, even more preferably 0.001% to 5.00% by mass, and particularly preferably 0.001% to 1.00% by mass.

In view of excellent metal residue removability, the mass ratio of the content of the specific compound to the content of the chloride ion (content of specific compound/content of chloride ion) is preferably 10,000 or less, more preferably 1,000 or less from, even more preferably 500 or less, and particularly preferably 100 or less. The lower limit thereof is not particularly limited, and is preferably 0.1 or more, more preferably 1 or more, and even more preferably 10 or more.

The content of the chloride ion in the composition is determined by ion chromatography. Specifically, examples of the ion chromatography device include Dionex ICS-2100 manufactured by Thermo Fisher Scientific Inc. In a case where the content of the chloride ion is low, the content of the chloride ion may be measured after the composition is concentrated using a concentrator column. In a case where the composition of raw materials is known, the content of the chloride ion may be calculated and obtained from the amount of the raw materials added.

The chloride ion may be added, for example, by a method of adding a compound containing a chloride ion to the composition during the preparation of the composition, immediately before treating a substrate, or the like. In addition, the chloride ion may be incorporated into the composition by using a raw material containing a trace of chloride ion as an impurity in preparing the composition.

Examples of the compound containing a chloride ion include a compound which dissociates in the composition to form a chloride ion and a cation.

Examples of the compound that produces a chloride ion and a cation include the specific compound and hydrochloric acid or a salt thereof (for example, a salt with an alkali metal and a salt with an alkaline earth metal).

(Solvent)

The composition may contain a solvent.

Examples of the solvent include water and an organic solvent. Among these, water is preferable.

As water, water having undergone a purification treatment such as distilled water, deionized water, or ultrapure water is preferable, and ultrapure water used for manufacturing semiconductors is more preferable. Water to be incorporated into the composition may contain a trace of components that are unavoidably mixed in.

The content of water with respect to the total mass of the composition is preferably 50% by mass or more, more preferably 65% by mass or more, and even more preferably 70% by mass or more. The upper limit thereof is not particularly limited. The upper limit with respect to the total mass of the composition is preferably 99.99% by mass or less, and more preferably 99.9% by mass or less.

As the organic solvent, a water-soluble organic solvent is preferable.

Examples of the water-soluble organic solvent include an ether-based solvent, an alcohol-based solvent, a ketone-based solvent, an amide-based solvent, a sulfur-containing solvent, and a lactone-based solvent. The water-soluble organic solvent is preferably an organic solvent that can be mixed with water at an arbitrary ratio.

The ether-based solvent is not particularly limited as long as it is a compound having an ether bond (—O—). Examples thereof include diethyl ether, diisopropyl ether, dibutyl ether, t-butyl methyl ether, cyclohexyl methyl ether, tetrahydrofuran, diethylene glycol, dipropylene glycol, triethylene glycol, polyethylene glycol, alkylene glycol monoalkyl ether (ethylene glycol monomethyl ether, ethylene glycol monobutyl ether, propylene glycol monomethyl ether, diethylene glycol monomethyl ether, dipropylene glycol monomethyl ether, tripropylene glycol monomethyl ether, and diethylene glycol monobutyl ether), and alkylene glycol dialkyl ether (diethylene glycol diethyl ether, diethylene glycol dipropyl ether, diethylene glycol dibutyl ether, triethylene glycol diethyl ether, tetraethylene glycol dimethyl ether, tetraethylene glycol diethyl ether, ethylene glycol dimethyl ether, diethylene glycol dimethyl ether, and triethylene glycol dimethyl ether).

The number of carbon atoms in the ether-based solvent is preferably 3 to 16, more preferably 4 to 14, and even more preferably 6 to 12.

Examples of the alcohol-based solvent include methanol, ethanol, 1-propanol, 2-propanol, 1-butanol, 2-butanol, ethylene glycol, propylene glycol, glycerin, 1,6-hexanediol, cyclohexanediol, sorbitol, xylitol, 2-methyl-2,4-pentanediol, 1,3-butanediol, and 1,4-butanediol.

The number of carbon atoms in the alcohol-based solvent is preferably 1 to 8, and more preferably 1 to 4.

Examples of the ketone-based solvent include acetone, methyl ethyl ketone, methyl isobutyl ketone, and cyclohexanone.

Examples of the amide-based solvent include formamide, monomethylformamide, dimethylformamide, acetamide, monomethylacetamide, dimethylacetamide, monoethylacetamide, diethylacetamide, and N-methylpyrrolidone.

Examples of the sulfur-containing solvent include dimethyl sulfone, dimethyl sulfoxide, and sulfolane.

Examples of the lactone-based solvent include γ-butyrolactone and 6-valerolactone.

One kind of organic solvent may be used alone, or two or more kinds of organic solvents may be used. In a case where two or more kinds of organic solvents are used, the total content of two or more kinds of organic solvents is preferably within the following range.

The content of the organic solvent is preferably 0.1% to 10% by mass with respect to the total mass of the composition.

(pH Adjuster)

The composition may contain a pH adjuster.

Examples of the pH adjuster include a basic compound and an acidic compound. The pH adjuster is appropriately selected depending on the target pH of the composition.

—Basic Compound—

The basic compound is a compound that exhibits alkalinity (pH higher than 7.0) in an aqueous solution.

Examples of the basic compound include an organic base, an inorganic base, and a salt of these.

Examples of the organic base include a quaternary ammonium salt, a salt of an alkylamine compound and a derivative thereof, an alkanolamine compound and a salt thereof, an amine oxide compound, a nitro compound, a nitroso compound, an oxime compound, a ketoxime compound, an aldoxime compound, and a lactam compound, and an isocyanide compound.

The quaternary ammonium salt as a pH adjuster is a compound different from the specific compound.

The quaternary ammonium salt is a quaternary ammonium cation-containing salt formed by the substitution of a nitrogen atom with four identical hydrocarbon groups (preferably alkyl groups).

Examples of the quaternary ammonium salt include a hydroxide, a fluoride, a bromide, an iodide, an acetate, and a carbonate.

As the quaternary ammonium salt, tetramethylammonium hydroxide (TMAH), tetraethylammonium hydroxide (TEAH), tetrapropylammonium hydroxide (TPAH), tetrabutylammonium hydroxide (TBAH), or tetra(hydroxyethyl) ammonium hydroxide is preferable, and TMAH, TEAH, TPAH, or TBAH is more preferable.

Examples of the inorganic base include alkali metal hydroxides such as sodium hydroxide and potassium hydroxide, alkaline earth metal hydroxides, and ammonia or a salt thereof.

As the basic compound, among the above, in view of few metal residues after use, economics, stability of the composition, and the like, a quaternary ammonium hydroxide is preferable, TMAH or TEAH is more preferable, and TEAH is even more preferable.

—Acidic Compound—

The acidic compound is an acidic compound that exhibits acidity (pH of less than 7.0) in an aqueous solution.

Examples of the acidic compound include an inorganic acid, an organic acid, and a salt of these.

Examples of the inorganic acid include sulfuric acid, hydrochloric acid, phosphoric acid, nitric acid, hydrofluoric acid, perchloric acid, and salts thereof. As the inorganic acid, sulfuric acid, hydrochloric acid, phosphoric acid, or nitric acid is preferable, and nitric acid, sulfuric acid, or hydrochloric acid is more preferable.

Examples of organic acid include carboxylic acid, sulfonic acid, and salts thereof.

Examples of the carboxylic acid include lower aliphatic monocarboxylic acids (having one to four carbon atoms) such as formic acid, acetic acid, propionic acid, and butyric acid, and salts thereof.

Examples of the sulfonic acid include methanesulfonic acid (MSA), benzenesulfonic acid, p-toluenesulfonic acid (tosylic acid), and a salt of these.

As the acidic compound, sulfuric acid, hydrochloric acid, phosphoric acid, nitric acid, or sulfonic acid or salts thereof are preferable, and sulfuric acid, hydrochloric acid, phosphoric acid, methanesulfonic acid, or p-toluenesulfonic acid is more preferable.

One kind of pH adjuster may be used alone, or two or more kinds of pH adjusters may be used in combination.

Furthermore, a commercially available pH adjuster or a pH adjuster appropriately synthesized by a known method may also be used.

The content of the pH adjuster with respect to the total mass of the composition is preferably 0.1% by mass or more, and more preferably 0.5% by mass or more. The upper limit thereof is not particularly limited, but is preferably 20.0% by mass or less with respect to the total mass of the composition.

It is also preferable to adjust the content of the pH adjuster within the aforementioned suitable range so that the pH of the composition falls into the suitable range which will be described later.

(Surfactant)

The composition may contain a surfactant.

The surfactant is not particularly limited as long as it is a compound having a hydrophilic group and a hydrophobic group (lipophilic group) in one molecule. Examples of the surfactant include an anionic surfactant, a cationic surfactant, and a nonionic surfactant. The quaternary ammonium salt as a surfactant is a compound different from the specific compound.

The hydrophobic group of the surfactant is not particularly limited, and examples thereof include an aliphatic hydrocarbon group, an aromatic hydrocarbon group, and a combination of these.

In a case where the hydrophobic group has an aromatic hydrocarbon group, the number of carbon atoms in the hydrophobic group is preferably 6 or more, and more preferably 10 or more.

In a case where the hydrophobic group does not include an aromatic hydrocarbon group and is composed of only an aliphatic hydrocarbon group, the number of carbon atoms in the hydrophobic group is preferably 8 or more, and more preferably 10 or more. The upper limit of the number of carbon atoms in the hydrophobic group is not particularly limited, and is preferably 24 or less, and more preferably 20 or less.

Examples of the anionic surfactant include an anionic surfactant having at least one kind of hydrophilic group selected from the group consisting of a sulfonic acid group, a carboxy group, a sulfuric acid ester group, and a phosphonic acid group in the molecule.

Examples of the anionic surfactant having a sulfonic acid group include alkylsulfonic acid, alkylbenzenesulfonic acid, alkylnaphthalenesulfonic acid, alkyldiphenylether sulfonic acid, fatty acid amide sulfonic acid, and salts thereof.

Examples of the anionic surfactant having a carboxylic acid group include polyoxyethylene alkyl ether carboxylic acid, polyoxyethylene alkyl ether acetic acid, polyoxyethylene alkyl ether propionic acid, a fatty acid, and salts thereof.

Examples of salts of the anionic surfactant include an ammonium salt, a sodium salt, a potassium salt, and a tetramethylammonium salt.

The cationic surfactant is not particularly limited as long as it is a compound having a cationic hydrophilic group and the aforementioned hydrophobic group. Examples of the cationic surfactant include a quaternary ammonium salt-based surfactant and an alkyl pyridium-based surfactant.

One kind of surfactant may be used alone, or two or more kinds of surfactants may be used.

The content of the surfactant with respect to the total mass of the composition is preferably 0.01% by mass or more, and more preferably 0.03% by mass or more. The upper limit thereof is not particularly limited. In view of suppressing foaming of the composition, the upper limit of the content of the surfactant with respect to the total mass of the composition is preferably 10% by mass or less, and more preferably 5% by mass or less.

(Abrasive Particles)

It is preferable that the composition substantially do not contain abrasive particles.

The abrasive particles mean particles that are contained in a polishing liquid used for performing a polishing treatment on a semiconductor substrate and have an average primary particle diameter of 5 nm or more.

For the composition, “substantially does not contain abrasive particles” means that in a case where the composition is measured using a commercially available measurement device for a light scattering-type particle measurement method in a liquid, the number of abrasive particles having an average primary particle diameter of 5 nm or more contained in 1 mL of the composition is 10 or less.

Examples of the abrasive particles include inorganic abrasive grains such as silica (including colloidal silica and fumed silica), alumina, zirconia, ceria, titania, germania, manganese oxide, and silicon carbide; and organic abrasive grains such as polystyrene, polyacryl, and polyvinyl chloride.

The content of the abrasive particles is measured using a commercially available measurement device for a light scattering-type particle measurement method in a liquid by using a laser as a light source.

The average primary particle diameter of particles such as abrasive particles is determined by measuring particle diameters (circular equivalent diameters) of 1,000 primary particles randomly selected from an image captured using a transmission electron microscope TEM2010 (acceleration voltage 200 kV) manufactured by JEOL Ltd., and calculating the arithmetic mean thereof. The circular equivalent diameter is the diameter of a virtual perfect circle assumed to have the same projected area as the projected area of a particle observed.

Examples of the method for removing the abrasive particles from the composition include a purification treatment such as filtering.

<pH>

The pH of the composition is not particularly limited and is, for example, in a range of 1.0 to 14.0.

In view of further improving the effect of the present invention, the pH of the composition is preferably 4.0 to 14.0, and more preferably 7.0 to 12.0.

In the present specification, the pH of the composition is determined by measuring pH at 25° C. by using a pH meter (F-51 (trade name) manufactured by HORIBA, Ltd.).

<Container>

The composition can be stored, transported, and used by being filled into any container.

It is preferable to use a container that has a high degree of cleanliness and is unlikely to cause elution of impurities. Examples of the container to be filled with the composition include a “CLEAN BOTTLE” series manufactured by AICELLO CORPORATION, and “PURE BOTTLE” manufactured by KODAMA PLASTICS Co., Ltd.

<Manufacturing Method>

The manufacturing method of the composition is not particularly limited. For example, by mixing together the components described above, the composition can be manufactured.

There is no particular limitation on the order and/or timing of mixing together the components described above. Examples of the manufacturing method of the composition include a method of sequentially adding the oxohalogen acid compound, the specific compound, and necessary optional components to a stirrer of a mixer filled with purified pure water and then thoroughly stirring the components such that the components are mixed together.

Examples of the manufacturing method of the composition include a method of adjusting the pH of the washing solution in advance by using a pH adjuster and then mixing together components and a method of mixing together components and then adjusting the pH to a preset value by using a pH adjuster.

Furthermore, the composition may be manufactured by a method of manufacturing a concentrated solution having a lower water content than the water content of the composition to be used, and diluting the solution with a diluent (preferably water) when the composition needs to be used so that the content of each component is adjusted to a predetermined content. The composition may also be manufactured by a method of diluting the concentrated solution with a diluent and then adjusting the pH thereof to a preset value by using a pH adjuster. For diluting the concentrated solution, a predetermined amount of diluent may be added to the concentrated solution or a predetermined amount of concentrated solution may be added to a diluent.

[Object to be Treated]

The composition is used for removing a transition metal-containing substance (particularly, a Ru-containing substance) on a substrate.

In the present specification, “on a substrate” includes, for example, all of the front and back, the lateral surfaces, and the inside of grooves of a substrate, and the like. The transition metal-containing substance on a substrate includes not only a transition metal-containing substance which directly contacts the surface of the substrate but also a transition metal-containing substance which is on the substrate through another layer.

The transition metal-containing substance is not particularly limited as long as it is a substance containing a transition metal (a transition metal atom).

Examples of the transition metal include a metal M selected from Ru (ruthenium), Rh (rhodium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Ir (iridium).

Among the above, a ruthenium (Ru)-containing substance is preferable as the transition metal-containing substance.

The content of Ru atoms in the Ru-containing substance with respect to the total mass of the Ru-containing substance is preferably equal to or higher than 10% by mass, more preferably equal to or higher than 30% by mass, even more preferably equal to or higher than 50% by mass, and particularly preferably equal to or higher than 90% by mass. The upper limit thereof is not particularly limited, but is preferably 100% by mass or less with respect to the total mass of the Ru-containing substance.

The Ru-containing substance is not particularly limited as long as it is a substance containing Ru (a Ru atom).

Examples of the Ru-containing substance include simple Ru, an Ru-containing alloy, an oxide of Ru, a nitride of Ru, and an oxynitride of Ru.

The oxide, nitride, and oxynitride described above may be a composite oxide, a composite nitride, and a composite oxynitride containing Ru.

The object to be treated is a substrate having a transition metal-containing substance (particularly, a Ru-containing substance).

That is, the object to be treated includes at least a substrate and a transition metal-containing substance (particularly, a Ru-containing substance) on the substrate.

The type of substrate is not particularly limited, but is preferably a semiconductor substrate.

Examples of the substrate include a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and a combination of these.

The use of the object to be treated having been treated with the composition according to the embodiment of the present invention is not particularly limited. For example, such an object to be treated may be used for dynamic random access memory (DRAM), ferroelectric random access memory (FRAM (registered trademark)), magnetoresistive random access memory (MRAM), and phase change random access memory (PRAM), or may be used for a logic circuit, a processor, and the like.

The form of the transition metal-containing substance (particularly, the Ru-containing substance) on the substrate is not particularly limited. For example, the Ru-containing substance may be disposed in the form of a film (particularly, a Ru-containing film), in the form of a wiring line (particularly, a Ru-containing wiring line), or in the form of particles.

As described above, the transition metal preferably includes Ru, and the object to be treated is preferably an object to be treated including a substrate and a Ru-containing film, a Ru-containing wiring line, or a particle-like Ru-containing substance which is disposed on the substrate.

Examples of the substrate, on which the Ru-containing substance is disposed in the form of particles, include a substrate obtained by performing dry etching on a substrate on which a Ru-containing film is disposed such that particle-like Ru-containing substances are then attached to the substrate as residues as will be described later, and a substrate obtained by performing a chemical mechanical polishing (CMP) treatment on the Ru-containing film such that particle-like Ru-containing substances are then attached to the substrate as residues as will be described later.

The thickness of the Ru-containing film is not particularly limited, and may be appropriately selected according to the use. For example, the thickness is preferably 200 nm or less, more preferably 100 nm or less, and even more preferably 50 nm or less. The lower limit thereof is not particularly limited, and is preferably 0.1 nm or more.

The Ru-containing film may be disposed only on one of the main surfaces of the substrate, or may be disposed on both the main surfaces of the substrate. Furthermore, the Ru-containing film may be disposed on the entire main surface of the substrate, or may be disposed on a portion of the main surface of the substrate.

The object to be treated may include various layers and/or structures as desired, in addition to the transition metal-containing substance particularly, the Ru-containing substance). For example, a metal wire, a gate electrode, a source electrode, a drain electrode, an insulating layer, a ferromagnetic layer, and/or a non-magnetic layer, and the like may be disposed on the substrate.

The substrate may include an exposed integrated circuit structure. Examples of the integrated circuit structure include an interconnection mechanism such as a metal wire and a dielectric material. Examples of metals and alloys used for the interconnection mechanism include aluminum, a copper-aluminum alloy, copper, titanium, tantalum, cobalt, silicon, titanium nitride, tantalum nitride, and tungsten. The substrate may include a layer of silicon oxide, silicon nitride, silicon carbide, and/or carbon-doped silicon oxide.

The size, thickness, shape, layer structure, and the like of the substrate are not particularly limited, and can be appropriately selected as desired.

<Manufacturing Method of Object to be Treated>

The manufacturing method of the object to be treated is not particularly limited, and known manufacturing methods can be used.

For example, by using a sputtering method, a chemical vapor deposition (CVD) method, a molecular beam epitaxy (MBE) method, or an atomic layer deposition (ALD) as the manufacturing method of the object to be treated, it is possible to form a transition metal-containing film (particularly, a Ru-containing film) on a substrate. In a case where a transition metal-containing film (particularly, a Ru-containing film) is formed by a sputtering method or a CVD method, sometimes the transition metal-containing film (particularly, the Ru-containing film) adheres to the back surface of the substrate (a surface on the side opposite to the side of the transition metal-containing film (particularly, the Ru-containing film)) on which the transition metal-containing film (particularly, the Ru-containing film) is disposed.

Furthermore, the above method may be performed via a predetermined mask such that a transition metal-containing wiring line (particularly, a Ru-containing wiring line) is formed on a substrate.

In addition, a predetermined treatment may be performed on a substrate on which a transition metal-containing film (particularly, a Ru-containing film) or a transition metal-containing wiring line (particularly, a Ru-containing wiring line) is disposed, such that the substrate is used as an object to be treated by the treatment method according to an embodiment of the present invention.

For example, a substrate on which a transition metal-containing film (particularly, a Ru-containing film) or a transition metal-containing wiring line (particularly, a Ru-containing wiring line) is disposed may be subjected to dry etching such that a substrate having dry etching residues containing a transition metal (particularly, Ru) is manufactured. Furthermore, a substrate on which a transition metal-containing film (particularly, a Ru-containing film) or a transition metal-containing wiring line (particularly, a Ru-containing wiring line) is disposed may be subjected to CMP such that a substrate having a transition metal-containing substance (particularly, a Ru-containing substance) is manufactured.

[Method for Treating Substrate]

The method for treating a substrate according to an embodiment of the present invention (hereinafter, also called "present treatment method") includes a step A of removing a transition metal-containing substance (particularly, a Ru-containing substance) on a substrate by using the composition described above.

In addition, the substrate on which a transition metal-containing substance (particularly, a Ru-containing substance) is disposed, which is an object to be treated by the present treatment method, is as described above.

Examples of the specific method of the step A include a method of bringing an object to be treated, a substrate on which a transition metal-containing substance (particularly, a Ru-containing substance) is disposed, into contact with the composition.

The method of bringing the substrate into contact with the composition is not particularly limited, and examples thereof include a method of immersing the object to be treated in the composition put in a tank, a method of spraying the composition onto the object to be treated, a method of causing the composition to flow on the object to be treated, and a combination of these. Among these, the method of immersing the object to be treated in the composition is preferable.

In order to further enhance the washing ability of the composition, a mechanical stirring method may also be used.

Examples of the mechanical stirring method include a method of circulating the composition on an object to be treated, a method of irrigating an object to be treated with the composition or spraying the composition onto an object to be treated, and a method of stirring the composition by using ultrasonic or megasonic waves.

The treatment time of the step A can be appropriately adjusted. The treatment time (the contact time between the composition and the object to be treated) is not particularly limited, and is preferably 0.25 to 10 minutes, and more preferably 0.5 to 2 minutes.

The temperature of the composition during the treatment is not particularly limited, but is preferably 20° C. to 75° C., more preferably 20° C. to 65° C., even more preferably 40° C. to 65° C., and particularly preferably 50° C. to 65° C.

In the step A, a treatment may be performed in which while the concentration of the oxohalogen acid compound and/or the specific compound in the composition is being measured, a solvent (preferably water) is added to the composition as necessary. In a case where this treatment is performed, the concentration of components in the composition can be stably maintained in a predetermined range.

Specifically, examples of suitable embodiments of the step A include a step A1 of performing a recess etching treatment on a Ru-containing wiring line disposed on a substrate by using the composition, a step A2 of removing a Ru-containing film on an outer edge portion of a substrate, on which the Ru-containing film is disposed, by using the composition, a step A3 of removing a Ru-containing substance attached to a back surface of a substrate, on which a Ru-containing film is disposed, by using the composition, a step A4 of removing a Ru-containing substance on a substrate, which has undergone dry etching, by using the composition, and a step A5 of removing a Ru-containing substance on a substrate, which has undergone a chemical mechanical polishing treatment, by using the composition.

As the step A, among the above, the step A2 or the step A3 is preferable.

Hereinafter, the present treatment method used in each of the above treatments will be described.

<Step A1>

Examples of the step A include a step A1 of performing a recess etching treatment by using the composition on a Ru-containing wiring line disposed on a substrate.

FIG. 1 is a schematic cross-sectional top view showing an example of a substrate having a Ru-containing wiring line (hereinafter, also called "wiring board") which is an object to be treated by the recess etching treatment in the step A1.

A wiring board 10*a* shown in FIG. 1 has a substrate not shown in the drawing, an insulating film 12 having a groove disposed on the substrate, a barrier metal layer 14 disposed along the interior wall of the groove, and a Ru-containing wiring line 16 that fills up the inside of the groove.

The substrate and the Ru-containing wiring line in the wiring board are as described above.

It is preferable that the Ru-containing wiring line contain simple Ru, an alloy of Ru, an oxide of Ru, a nitride of Ru, or an oxynitride of Ru.

The material constituting the barrier metal layer in the wiring board is not particularly limited, and examples thereof include TiN and TaN.

In FIG. 1, an embodiment is illustrated in which the wiring board has a barrier metal layer. However, the wiring board may not have the barrier metal layer.

The method for manufacturing the wiring board is not particularly limited, and examples thereof include a method having a step of forming an insulating film on a substrate, a step of forming a groove in the insulating film, a step of forming a barrier metal layer on the insulating film, a step of forming a Ru-containing film that fills up the groove, and a step of performing a smoothing treatment on the Ru-containing film.

In the step A1, by performing a recess etching treatment on the Ru-containing wiring line in the wiring board by using the aforementioned composition, a portion of the Ru-containing wiring line can be removed, and a recess can be formed.

Figure 2:
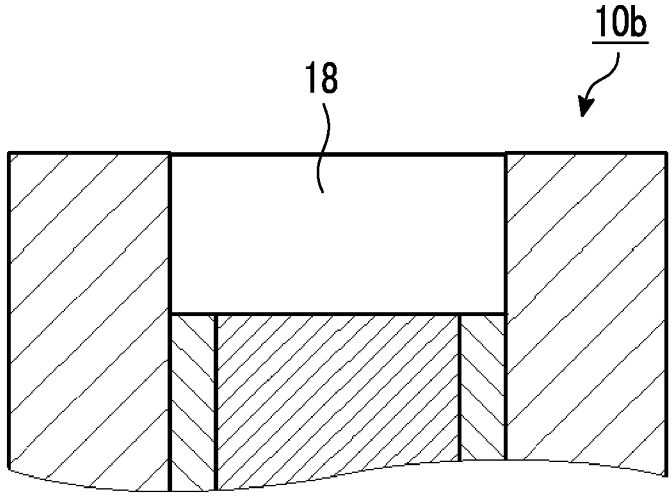
FIG. 2 is a schematic cross-sectional top view showing an example of an object to be treated having undergone the step A1.

More specifically, in a case where the step A1 is performed, as shown in the wiring board 10*b* in FIG. 2, a portion of the barrier metal layer 14 and the Ru-containing wiring line 16 is removed, and a recess 18 is formed.

Examples of specific methods of the step A1 include a method of bringing the wiring board into contact with the composition.

The method of bringing the wiring board into contact with the composition is as described above.

The suitable ranges of the contact time between the chemical liquid and the wiring board and the temperature of the chemical liquid are as described above.

(Step B)

Before or after the step A1, as necessary, a step B of treating the substrate obtained by the step A1 by using a predetermined solution (hereinafter, also called "specific solution") may be performed.

Particularly, as described above, in a case where the barrier metal layer is disposed on the substrate, the solubility in the composition according to the embodiment of the present invention varies between the component constituting the Ru-containing wiring line and the component constituting the barrier metal layer depending on the type of components. In this case, it is preferable to adjust the degree of solubility of the Ru-containing wiring line and the barrier metal layer by using a solution that exhibits a higher dissolving ability to the barrier metal layer.

In this respect, as the specific solution, a solution is preferable which exhibits a poor dissolving ability to the Ru-containing wiring line but exhibits an excellent dissolving ability to the substance constituting the barrier metal layer.

Examples of the specific solution include a solution selected from the group consisting of a mixed solution of hydrofluoric acid and hydrogen peroxide water (FPM), a mixed solution of sulfuric acid and hydrogen peroxide water (SPM), a mixed solution of aqueous ammonia and hydrogen peroxide water (APM), and a mixed solution of hydrochloric acid and hydrogen peroxide water (HPM).

The composition of FPM is, for example, preferably in a range of "hydrofluoric acid:hydrogen peroxide water:water=1:1:1" to "hydrofluoric acid:hydrogen peroxide water:water=1:1:200" (volume ratio).

The composition of SPM is, for example, preferably in a range of "sulfuric acid:hydrogen peroxide water:water=3:1:0" to "sulfuric acid:hydrogen peroxide water:water=1:1:10" (volume ratio).

The composition of APM is, for example, preferably in a range of "aqueous ammonia:hydrogen peroxide water:water=1:1:1" to "aqueous ammonia:hydrogen peroxide water:water=1:1:30" (volume ratio).

The composition of HPM is, for example, preferably in a range of "hydrochloric acid:hydrogen peroxide water:water=1:1:1" to "hydrochloric acid:hydrogen peroxide water:water=1:1:30" (volume ratio).

The preferred compositional ratio described above means a compositional ratio determined in a case where the hydrofluoric acid is 49% by mass hydrofluoric acid, the sulfuric acid is 98% by mass sulfuric acid, the aqueous ammonia is 28% by mass aqueous ammonia, the hydrochloric acid is 37% by mass hydrochloric acid, and the hydrogen peroxide water is 31% by mass hydrogen peroxide water.

Among these, as the specific solution, in view of dissolving ability for the barrier metal layer, SPM, APM, or HPM is preferable.

As the specific solution, in view of reducing roughness, APM, HPM, or FPM is preferable, and APM is more preferable.

As the specific solution, in view of excellent performance balance, APM or HPM is preferable.

In the step B, as the method of treating the substrate obtained by the step A1 by using the specific solution, a method of bringing the substrate obtained by the step A1 into contact with the specific solution is preferable.

The method of bringing the substrate obtained by the step A1 into contact with the specific solution is not particularly limited, and examples thereof include the same method as the method of bringing the substrate into contact with the composition.

The contact time between the specific solution and the substrate obtained by the step A1 is, for example, preferably 0.25 to 10 minutes, and more preferably 0.5 to 5 minutes.

In the present treatment method, the step A1 and the step B may be alternately repeated.

In a case where the steps are alternately repeated, it is preferable that each of the step A1 and the step B be performed 1 to 10 times. Furthermore, in a case where the step A1 and the step B are alternately repeated, the step performed firstly and the step performed lastly may be any of the step A1 or the step B.

<Step A2>

Examples of the step A include a step A2 of removing a Ru-containing film at the outer edge of a substrate, on which the Ru-containing film is disposed, by using the composition.

Figure 3:
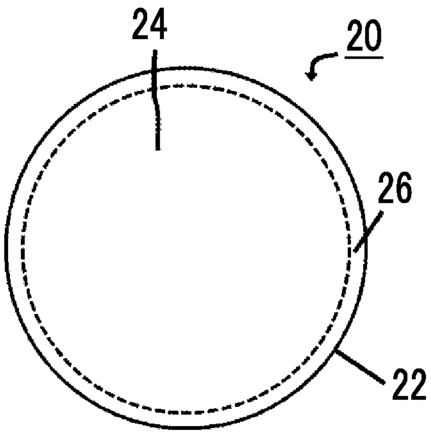
FIG. 3 is a schematic view showing an example of an object to be treated used in a step A2.

FIG. 3 is a schematic view (top view) showing an example of a substrate, on which a Ru-containing film is disposed, as an object to be treated by the step A2.

An object 20 to be treated by the step A2 shown in FIG. 3 is a laminate having a substrate 22 and a Ru-containing film 24 disposed on one main surface (entire region surrounded by the solid line) of the substrate 22. As will be described later, in step A2, the Ru-containing film 24 positioned at an outer edge 26 (the region outside the broken line) of the object 20 to be treated is removed.

The substrate and the Ru-containing film in the object to be treated are as described above.

It is preferable that the Ru-containing film contain simple Ru, an alloy of Ru, an oxide of Ru, a nitride of Ru, or an oxynitride of Ru.

The specific method of the step A2 is not particularly limited, and examples thereof include a method of supplying the composition from a nozzle such that the composition comes into contact with only the Ru-containing film as a removal target at the outer edge portion of the substrate.

At the time of performing the treatment of the step A2, it is possible to preferably use the substrate treatment device and the substrate treatment method described in JP2010-267690A, JP2008-080288A, JP2006-100368A, and JP2002-299305A.

The method of bringing the object to be treated into contact with the composition is as described above.

The suitable ranges of the contact time between the composition and the object to be treated and the temperature of the composition are as described above.

<Step A3>

Examples of the step A include a step A3 of removing a Ru-containing substance attached to the back surface of a substrate, on which a Ru-containing film is disposed, by using the composition.

Examples of the object to be treated by the step A3 include the object to be treated used in the step A2. At the time of forming the object to be treated includes a Ru-containing film disposed on one main surface of the substrate, used in the step A2, the Ru-containing film is formed by sputtering, CVD, or the like. At this time, sometimes a Ru-containing substance is attached to a surface (back surface) of the substrate that is opposite to the Ru-containing film. The step A3 is performed to remove such a Ru-containing substance in the object to be treated.

The specific method of the step A3 is not particularly limited, and examples thereof include a method of spraying the composition such that the composition comes into contact with only the back surface of the substrate.

The method of bringing the object to be treated into contact with the composition is as described above.

The suitable ranges of the contact time between the composition and the object to be treated and the temperature of the composition are as described above.

<Step A4>

Examples of the step A include a step A4 of removing a Ru-containing substance on a substrate, which has undergone dry etching, by using the composition.

Figure 4:
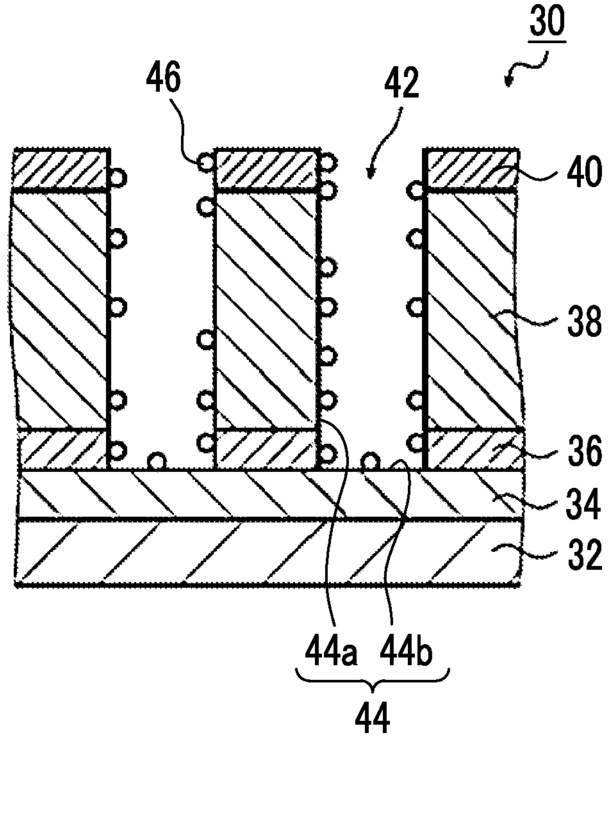
FIG. 4 is a schematic cross-sectional view showing an example of an object to be treated used in a step A4.

FIG. 4 is a schematic view showing an example of the object to be treated by the step A4.

An object 30 to be treated shown in FIG. 4 comprises a Ru-containing film 34, an etching stop layer 36, an interlayer insulating film 38, a metal hard mask 40 in this order on a substrate 32. Through a dry etching process or the like, a hole 42 exposing the Ru-containing film 34 is formed at a predetermined position. That is, the object to be treated shown in FIG. 4 is a laminate which comprises the substrate 32, the Ru-containing film 34, the etching stop layer 36, the interlayer insulating film 38, and the metal hard mask 40 in this order and comprises the hole 42 that extends from the surface of the metal hard mask 40 to the surface of the Ru-containing film 34 at the position of the opening portion of the metal hard mask 40. An interior wall 44 of the hole 42 is constituted with a cross-sectional wall 44*a* which includes the etching stop layer 36, the interlayer insulating film 38, and the metal hard mask 40, and a bottom wall 44*b* which includes the exposed Ru-containing film 34. A dry etching residue 46 is attached to the interior wall 44.

The dry etching residue includes a Ru-containing substance.

It is preferable that the Ru-containing film contain simple Ru, an alloy of Ru, an oxide of Ru, a nitride of Ru, or an oxynitride of Ru.

It is preferable that the Ru-containing substance contain simple Ru, an alloy of Ru, an oxide of Ru, a nitride of Ru, or an oxynitride of Ru.

As the interlayer insulating film and the metal hard mask, known materials are selected.

Although FIG. 4 describes an embodiment in which a metal hard mask is used, a resist mask formed of a known photoresist material may also be used.

Examples of the specific method of the step A4 include a method of bringing the aforementioned object to be treated into contact with the composition.

The method of bringing the wiring board into contact with the composition is as described above.

The suitable ranges of the contact time between the chemical liquid and the wiring board and the temperature of the chemical liquid are as described above.

<Step A5>

Examples of the step A include a step A5 of removing a Ru-containing substance on a substrate, which has undergone a chemical mechanical polishing (CMP) treatment, by using the composition.

The CMP technique is used for smoothing an insulating film, smoothing connection holes, and a process of manufacturing damascene wiring line and the like. In some cases, a substrate having undergone CMP is contaminated with a large amount of particles used as abrasive particles, metal impurities, and the like. Therefore, it is necessary to remove these contaminants and wash the substrate before the next processing stage starts. In a case where the object to be treated by CMP has a Ru-containing wiring line and the step A5 is performed, it is possible to remove a Ru-containing substance which is generated in a case where the object to be treated by CMP includes a Ru-containing wiring line or a Ru-containing film and attached onto the substrate.

As described above, examples of the object to be treated by the step A5 include a substrate having undergone CMP that has a Ru-containing substance.

It is preferable that the Ru-containing substance contain simple Ru, an alloy of Ru, an oxide of Ru, a nitride of Ru, or an oxynitride of Ru.

Examples of the specific method of the step A5 include a method of bringing the aforementioned object to be treated into contact with the composition.

The method of bringing the wiring board into contact with the composition is as described above.

The suitable ranges of the contact time between the chemical liquid and the wiring board and the temperature of the chemical liquid are as described above.

<Step C>

As necessary, the present treatment step may have a step C of performing a rinsing treatment on the substrate obtained by the step A by using a rinsing liquid after the step A.

As the rinsing liquid, for example, hydrofluoric acid (preferably 0.001% to 1% by mass hydrofluoric acid), hydrochloric acid (preferably 0.001% to 1% by mass hydrochloric acid), hydrogen peroxide water (preferably 0.5% to 31% by mass hydrogen peroxide water, and more preferably 3% to 15% by mass hydrogen peroxide water), a mixed solution of hydrofluoric acid and hydrogen peroxide water (FPM), a mixed solution of sulfuric acid and hydrogen peroxide water (SPM), a mixed solution of aqueous ammonia and hydrogen peroxide water (APM), a mixed solution of hydrochloric acid and hydrogen peroxide water (HPM), aqueous carbon dioxide (preferably 10 to 60 ppm by mass aqueous carbon dioxide), aqueous ozone (preferably 10 to 60 ppm by mass aqueous ozone), aqueous hydrogen (preferably 10 to 20 ppm by mass aqueous hydrogen), an aqueous citric acid solution (preferably a 0.01% to 10% by mass aqueous citric acid solution), acetic acid (preferably an undiluted acetic acid solution or a 0.01% to 10% by mass aqueous acetic acid solution), sulfuric acid (preferably a 1% to 10% by mass aqueous sulfuric acid solution), aqueous ammonia (preferably 0.01% to 10% by mass aqueous ammonia), isopropyl alcohol (IPA), an aqueous hypochlorous acid solution (preferably a 1% to 10% by mass aqueous hypochlorous acid solution), aqua regia (preferably aqua regia obtained by mixing together "37% by mass hydrochloric acid:60% by mass nitric acid" at a volume ratio of "2.6:1.4" to "3.4:0.6"), ultrapure water, nitric acid (preferably 0.001% to 1% by mass nitric acid), perchloric acid (preferably 0.001% to 1% by mass perchloric acid), an aqueous oxalic acid solution (preferably a 0.01% to 10% by mass aqueous oxalic acid solution), or an aqueous periodic acid solution (preferably a 0.5% to 10% by mass aqueous periodic acid solution, examples of the periodic acid include orthoperiodic acid and metaperiodic acid) is preferable.

The preferred conditions required to FPM, SPM, APM, and HPM are the same as the suitable aspects of, for example, to FPM, SPM, APM, and HPM used as the specific solution described above.

The hydrofluoric acid, nitric acid, perchloric acid, and hydrochloric acid mean aqueous solutions obtained by dissolving HF, $HNO_3$, $HClO_4$, and HCl in water respectively.

The ozonated water, aqueous carbon dioxide, and aqueous hydrogen mean aqueous solutions obtained by dissolving $O_3$, $CO_2$, and $H_2$ in water respectively.

As long as the purpose of the rinsing step is not impaired, these rinsing liquids may be used by being mixed together.

Among the above, as the rinsing liquid, in view of further reducing chlorine remaining on the surface of the substrate after the rinsing step, aqueous carbon dioxide, aqueous ozone, aqueous hydrogen, hydrofluoric acid, an aqueous citric acid solution, hydrochloric acid, sulfuric acid, aqueous ammonia, hydrogen peroxide water, SPM, APM, HPM, IPA, an aqueous hypochlorous acid solution, aqua regia, or FPM is preferable, and hydrofluoric acid, hydrochloric acid, hydrogen peroxide water, SPM, APM, HPM, or FPM is more preferable.

Examples of the specific method of the step C include a method of bringing the substrate as an object to be treated obtained by the step A into contact with the rinsing liquid.

The method of bringing the substrate into contact with the rinsing liquid is performed by immersing the substrate in the rinsing liquid put in a tank, spraying the rinsing liquid on the substrate, causing the rinsing liquid to flow on the substrate, or a method composed of an any combination of these.

The treatment time (contact time between the rinsing liquid and the object to be treated) is not particularly limited, but is 5 seconds to 5 minutes for example.

The temperature of the rinsing liquid during the treatment is not particularly limited. Generally, the temperature of the rinsing liquid is preferably 16° C. to 60° C., and more preferably 18° C. to 40° C. In a case where SPM is used as the rinsing liquid, the temperature thereof is preferably 90° C. to 250° C.

As necessary, the present treatment method may have a step D of performing a drying treatment after the step C. The method of the drying treatment is not particularly limited, and examples thereof include spin drying, causing a drying gas to flow on the substrate, heating the substrate by a heating unit (for example, a hot plate or an infrared lamp), isopropyl alcohol (IPA) vapor drying, Marangoni drying, Rotagoni drying, and any combination of these.

The drying time can be appropriately changed depending on the specific method to be used. For example, the drying time is about 30 seconds to a few minutes.

<Step D>

As necessary, the present treatment method may have a step D of performing a drying treatment after the step C.

The method of the drying treatment is not particularly limited, and examples thereof include spin drying, placing the substrate under a drying gas stream, heating the substrate by a heating unit (for example, a hot plate or an infrared lamp), isopropyl alcohol (IPA) vapor drying, Marangoni drying, Rotagoni drying, and a combination of these.

The drying time can be appropriately changed depending on the specific method to be used. For example, the drying time is about 30 seconds to a few minutes.

<Other Steps>

The present treatment method may be performed in combination before or after other steps performed on a substrate. While being performed, the present treatment method may be incorporated into those other steps. Alternatively, while those other steps are being performed, the treatment method according to the embodiment of the present invention may be incorporated into the steps and performed.

Examples of those other steps include a step of forming each structure such as a metal wire, a gate structure, a source structure, a drain structure, an insulating layer, a ferromagnetic layer, and/or a non-magnetic layer (for example, layer formation, etching, chemical mechanical polishing, modification, and the like), a step of forming resist, an exposure step and a removing step, a heat treatment step, a washing step, and an inspection step.

The present treatment method may be performed at any stage among the back-end process (BEOL: back end of the line), the middle process (MOL: middle of the line), and the front-end process (FEOL: front end of the line). It is preferable that the present treatment method be performed in a front-end process or a middle process.

EXAMPLES

Hereinafter, the present invention will be more specifically described based on examples. The materials, the amounts and ratios of the materials used, the details of treatments, and the procedures of treatments shown in the following examples can be appropriately changed as long as the gist of the present invention is maintained. Therefore, the scope of the present invention is not restricted by the following examples.

[Preparation of Composition]

The compositions having the makeups shown in the following tables were prepared, and the prepared compositions were tested as below.

All of the following components used for preparing the compositions are products obtained from the market, and include the products classified as a semiconductor grade or products classified as a high-purity grade.

<Oxohalogen Acid Compound>

Hypochlorous acid
Sodium hypochlorite
Chlorous acid
Sodium chlorite
Chloric acid
Sodium chlorate
Bromic acid
Sodium bromate <Specific Compound>

D-1: ethyltrimethylammonium hydroxide
D-2: ethyltrimethylammonium chloride
D-3: ethyltrimethylammonium bromide
D-4: ethyltrimethylammonium fluoride
E-1: diethyldimethylammonium hydroxide
E-2: diethyldimethylammonium chloride
E-3: diethyldimethylammonium bromide
E-4: diethyldimethylammonium fluoride
F-1: methyltriethylammonium hydroxide
F-2: methyltriethylammonium chloride
F-3: methyltriethylammonium bromide
F-4: methyltriethylammonium fluoride
G-1: trimethyl(hydroxyethyl)ammonium hydroxide
H-1: methyltributylammonium hydroxide
I-1: dimethyldipropylammonium hydroxide
J-1: benzyltrimethylammonium hydroxide
K-1: benzyltriethylammonium hydroxide
L-1: triethyl(hydroxyethyl)ammonium hydroxide
N-1: tetradecyltrimethylammonium hydroxide
M-1: dodecyltrimethylammonium hydroxide <Compound for Comparison>

A-2: tetramethylammonium chloride
B-1: tetraethylammonium hydroxide

<Water>

Ultrapure water

EXAMPLES AND COMPARATIVE EXAMPLES

Hypochlorous acid, the specific compound, and a chloride ion at the contents described in the following table were added to ultrapure water, thereby preparing a mixed solution. Then, the mixed solution was thoroughly stirred with a stirrer, thereby obtaining a composition of Example 1.

Compositions of examples and comparative examples other than Example 1 were prepared in the same procedure as in Example 1, except that each component and the like were changed according to the following tables.

The chloride ion concentration in the composition having a low chloride ion concentration was measured using a concentrator column, as necessary. The chloride ion contained in the composition is derived from THE hydrochloric acid or a salt thereof, THE specific compound, a decomposition product of the oxohalogen acid compound, and an impurity mixed in the synthesis process of the specific compound.

[Test]

<Ru Dissolving Ability>

Substrates were prepared in which a Ru layer (layer composed of simple Ru) was formed on one surface of a commercial silicon wafer (diameter: 12 inches) by a PVD method.

Each of the obtained substrates was put in a container filled with the composition of each of the examples or comparative examples, and the composition was stirred to perform a Ru layer removal treatment for 1 minute. The temperature of the composition was 25° C.

The thicknesses of the Ru layers before and after the treatment were measured with an X-ray fluorescence analyzer for thin film evaluation (XRF AZX-400, manufactured by Rigaku Corporation). From the difference between the thickness of the Ru layer before the treatment and the thickness of the Ru layer after the treatment, an etching rate (Å/min) of the Ry layer was calculated. The calculated etching rate of the Ru layer was evaluated according to the following evaluation standard.

(Evaluation Standard)

5: The etching rate is 250 Å/min or more.

4: The etching rate is 200 Å/min or more and less than 250 Å/min.

3: The etching rate is 150 Å/min or more and less than 200 Å/min.

2: The etching rate is 100 Å/min or more and less than 150 Å/min.

1: The etching rate is less than 100 Å/min.

<Metal Residue Removability>

By using a total reflection X-ray fluorescence analyzer (TXRF-V310, manufactured by Rigaku Corporation), the amount of metal residues (metal residues other than Ru constituting the Ru layer) on the substrate surface after the <Ru dissolving ability> described above was quantified. The amount of metal residues before the treatment with the composition and the amount of metal residues after the treatment with the composition are compared with each other, proportion of metal residue (%)=100×[amount of metal residues after treatment (atoms/$cm^2$)]/[amount of metal residues before treatment (atoms/$cm^2$)] was calculated, and the metal residue removability was evaluated according to the following evaluation standard.

(Evaluation Standard)

5: The proportion of metal residue is 25% or less.

4: The proportion of metal residue is more than 25% and 50% or less.

3: The proportion of metal residue is more than 50% and 75% or less.

2: The proportion of metal residues is more than 75%.

The evaluation results are shown in Tables 1 and 2.

Each description in the tables is as follows.

"Total number of carbon atoms" in the column of "Specific compound" means the sum of carbon atoms that the specific compound has.

The column of "(A)/(B)" shows the mass ratio of the content of the specific compound to the content of the chloride ion.

The column of "pH" shows a pH measured in a composition at 25° C. by using a known pH meter by a method based on JIS Z8802-1984.

"Remainder" in the column of "Water" means that the remainder other than the oxohalogen acid compound, the specific compound, and the chloride ion contained in the composition is water.

TABLE 1

| | Composition | | | | | |
|---|---|---|---|---|---|---|
| | Oxohalogen acid compound | | (A) Specific compound | | | (B) Chloride ion |
| | Type | Content [% by mass] | Type | Content [% by mass] | Total number of carbon atoms | Content [% by mass] |
| Example 1 | Hypochlorous acid | 1.0 | D-1 | 1.0 | 5 | 0.02 |
| Example 2 | Hypochlorous acid | 5.0 | E-1 | 5.0 | 6 | 0.10 |
| Example 3 | Hypochlorous acid | 2.5 | F-1 | 3.0 | 7 | 0.08 |
| Example 4 | Hypochlorous acid | 3.0 | G-1 | 6.0 | 5 | 0.02 |
| Example 5 | Hypochlorous acid | 5.0 | H-1 | 10.0 | 13 | 0.04 |
| Example 6 | Hypochlorous acid | 5.0 | I-1 | 5.0 | 8 | 0.20 |
| Example 7 | Hypochlorous acid | 5.0 | J-1 | 3.0 | 10 | 0.25 |
| Example 8 | Hypochlorous acid | 5.0 | K-1 | 4.0 | 13 | 0.20 |
| Example 9 | Hypochlorous acid | 5.0 | L-1 | 4.0 | 8 | 0.25 |
| Example 10 | Hypochlorous acid | 5.0 | M-1 | 5.0 | 15 | 0.20 |
| Example 11 | Hypochlorous acid | 5.0 | N-1 | 5.0 | 16 | 0.22 |
| Example 12 | Hypochlorous acid | 5.0 | E-2 | 1.2 | 6 | 0.30 |
| Example 13 | Hypochlorous acid | 5.0 | E-3 | 2.0 | 6 | 0.25 |

TABLE 1-continued

| | | | | | | |
|---|---|---|---|---|---|---|
| Example 14 | Hypochlorous acid | 5.0 | E-4 | 1.5 | 6 | 0.20 |
| Example 15 | Sodium hypochlorite | 2.0 | D-2 | 3.0 | 5 | 0.20 |
| Example 16 | Sodium hypochlorite | 2.0 | D-1 | 1.2 | 5 | 0.08 |
| Example 17 | Chlorous acid | 1.5 | D-1 | 1.2 | 5 | 0.02 |
| Example 18 | Chlorous acid | 2.0 | E-1 | 3.2 | 6 | 0.05 |
| Example 19 | Sodium chlorite | 1.5 | F-1 | 1.5 | 7 | 0.10 |
| Example 20 | Sodium chlorite | 2.0 | G-1 | 2.0 | 5 | 0.20 |
| Example 21 | Chloric acid | 1.0 | D-1 | 5.0 | 5 | 0.20 |
| Example 22 | Sodium chlorate | 2.0 | D-1 | 1.0 | 5 | 0.05 |
| Example 23 | Hypochlorous acid | 5.0 | E-1 | 10.0 | 6 | 0.04 |
| Example 24 | Sodium hypochlorite | 5.0 | E-1 | 3.0 | 6 | 0.20 |

| | Composition | | | Evaluation result | |
|---|---|---|---|---|---|
| | | | | Ru dissolving | Metal residue |
| | (A)/(B) | pH | Water | ability | removability |
| Example 1 | 50 | 10.0 | Remainder | 5 | 4 |
| Example 2 | 50 | 11.2 | Remainder | 5 | 5 |
| Example 3 | 38 | 11.7 | Remainder | 5 | 5 |
| Example 4 | 300 | 12.0 | Remainder | 5 | 4 |
| Example 5 | 250 | 12.0 | Remainder | 4 | 4 |
| Example 6 | 25 | 8.5 | Remainder | 4 | 5 |
| Example 7 | 12 | 7.5 | Remainder | 4 | 5 |
| Example 8 | 20 | 7.6 | Remainder | 4 | 5 |
| Example 9 | 16 | 7.6 | Remainder | 4 | 5 |
| Example 10 | 25 | 8.1 | Remainder | 3 | 5 |
| Example 11 | 23 | 8.0 | Remainder | 2 | 5 |
| Example 12 | 4 | 7.2 | Remainder | 5 | 4 |
| Example 13 | 8 | 8.0 | Remainder | 4 | 4 |
| Example 14 | 8 | 7.2 | Remainder | 4 | 4 |
| Example 15 | 15 | 12.0 | Remainder | 5 | 5 |
| Example 16 | 15 | 12.0 | Remainder | 5 | 4 |
| Example 17 | 60 | 7.0 | Remainder | 5 | 4 |
| Example 18 | 64 | 7.2 | Remainder | 5 | 5 |
| Example 19 | 15 | 10.2 | Remainder | 4 | 4 |
| Example 20 | 10 | 10.3 | Remainder | 4 | 4 |
| Example 21 | 25 | 7.2 | Remainder | 3 | 5 |
| Example 22 | 20 | 10.2 | Remainder | 3 | 4 |
| Example 23 | 250 | 12.5 | Remainder | 4 | 4 |
| Example 24 | 15 | 13.5 | Remainder | 4 | 5 |

TABLE 2

| | Composition | | | | | |
|---|---|---|---|---|---|---|
| | Oxohalogen acid compound | | (A) Specific compound | | | (B) Chloride ion |
| | Type | Content [% by mass] | Type | Content [% by mass] | Total number of carbon atoms | Content [% by mass] |
| Example 25 | Chlorous acid | 5.0 | F-1 | 2.0 | 7 | 0.10 |
| Example 26 | Hypochlorous acid | 5.0 | D-1 | 3.5 | 5 | 0.05 |
| Example 27 | Chlorous acid | 5.0 | D-1 | 2.0 | 5 | 0.20 |
| Example 28 | Chlorous acid | 5.0 | D-1 | 1.0 | 5 | 0.40 |
| Example 29 | Hypochlorous acid | 10.0 | F-1 | 9.0 | 7 | 0.50 |
| Example 30 | Hypochlorous acid | 12.0 | F-2 | 9.0 | 7 | 0.60 |
| Example 31 | Hypochlorous acid | 25.0 | F-3 | 10.0 | 7 | 0.20 |

TABLE 2-continued

| | | | | | | |
|---|---|---|---|---|---|---|
| Example 32 | Hypochlorous acid | 30.0 | F-4 | 10.0 | 7 | 0.30 |
| Example 33 | Hypochlorous acid | 0.05 | D-1 | 1.0 | 5 | 0.001 |
| Example 34 | Hypochlorous acid | 0.01 | D-2 | 1.0 | 5 | 0.20 |
| Example 35 | Chlorous acid | 10.0 | D-3 | 12.0 | 5 | 0.10 |
| Example 36 | Hypochlorous acid | 10.0 | D-4 | 25.0 | 5 | 0.10 |
| Example 37 | Chlorous acid | 10.0 | F-2 | 1.0 | 7 | 2.00 |
| Example 38 | Chlorous acid | 10.0 | D-2 | 5.0 | 5 | 5.00 |
| Example 39 | Chlorous acid | 10.0 | F-2 | 3.0 | 7 | 10.00 |
| Example 40 | Sodium hypochlorite | 1.0 | F-1 | 2.0 | 7 | 0.0005 |
| Example 41 | Bromic acid | 1.0 | F-1 | 2.0 | 7 | 0.02 |
| Example 42 | Sodium bromate | 5.0 | F-2 | 6.5 | 7 | 0.001 |
| Example 43 | Sodium bromate | 5.0 | D-1 | 5.0 | 5 | 1 |
| Comparative Example 1 | Hypochlorous acid | 2.0 | A-2 | 1.5 | 4 | 0.02 |
| Comparative Example 2 | Sodium hypochlorite | 2.0 | B-1 | 3.0 | 8 | 0.002 |
| Comparative Example 3 | Hypochlorous acid | 1.0 | D-1 | 0.05 | 5 | 0.01 |
| Comparative Example 4 | Sodium hypochlorite | 1.0 | D-1 | 0.1 | 5 | 0.001 |
| Comparative Example 5 | Sodium hypochlorite | 10.0 | E-2 | 26.0 | 6 | 0.01 |

| | Composition | | | Evaluation result | |
|---|---|---|---|---|---|
| | | | | Ru dissolving | Metal residue |
| | (A)/(B) | pH | Water | ability | removability |
| Example 25 | 20 | 4.5 | Remainder | 4 | 4 |
| Example 26 | 70 | 6.2 | Remainder | 4 | 5 |
| Example 27 | 10 | 3.0 | Remainder | 2 | 4 |
| Example 28 | 3 | 1.5 | Remainder | 2 | 4 |
| Example 29 | 18 | 9.8 | Remainder | 5 | 5 |
| Example 30 | 15 | 8.7 | Remainder | 4 | 5 |
| Example 31 | 50 | 9.2 | Remainder | 4 | 5 |
| Example 32 | 33 | 8.0 | Remainder | 3 | 5 |
| Example 33 | 1000 | 8.5 | Remainder | 4 | 3 |
| Example 34 | 5 | 7.5 | Remainder | 2 | 4 |
| Example 35 | 120 | 7.8 | Remainder | 4 | 4 |
| Example 36 | 250 | 12.0 | Remainder | 4 | 4 |
| Example 37 | 1 | 6.2 | Remainder | 4 | 3 |
| Example 38 | 1 | 6.0 | Remainder | 4 | 4 |
| Example 39 | 0.3 | 6.5 | Remainder | 4 | 3 |
| Example 40 | 4000 | 12. | Remainder | 4 | 3 |
| Example 41 | 100 | 7.8 | Remainder | 3 | 4 |
| Example 42 | 6500 | 12.0 | Remainder | 3 | 4 |
| Example 43 | — | 11.8 | Remainder | 3 | 2 |
| Comparative Example 1 | — | 7.6 | Remainder | 1 | 3 |
| Comparative Example 2 | — | 8.0 | Remainder | 1 | 2 |
| Comparative Example 3 | — | 7.2 | Remainder | 1 | 3 |
| Comparative Example 4 | — | 11.5 | Remainder | 1 | 2 |
| Comparative Example 5 | — | 12.0 | Remainder | 1 | 2 |

From the results shown in the tables, it has been confirmed that in a case where the composition according to the embodiment of the present invention is used, the desired effect is obtained.

Through the comparison between Examples 1 to 4, 12, and 15 to 20 and Examples 21, 22, and 41 to 43, the effect of the present invention is further improved in a case where the oxohalogen acid compound is at least one compound selected from the group consisting of hypochlorous acid, chlorous acid, and salts of these.

Through the comparison between Examples 1 to 4 and the like and Examples 35 and 36, it has been confirmed that the effect of the present invention is further improved in a case where the content of the specific compound is 1.0% to 10.0% by mass with respect to the total mass of the composition.

Through the comparison between Examples 2 and 3 and Examples 1 and 4, the comparison between Examples 15 and 18 and Examples 16 and 17, the comparison between Example 21 and Example 22, the comparison between Examples 24 and 26 and Examples 25, 27, and 28, and the comparison between Example 38 and Examples 37 and 40, it has been confirmed that the metal residue removability is further improved in a case where the content of the specific compound is 3.0% to 25.0% by mass with respect to the total mass of the composition.

Through the comparison between Examples 1 and the like and Example 43, it has been confirmed that the metal residue removability is further improved in a case where the composition further contains a chloride ion.

Through the comparison between Example 1 and the like and Examples 39 and 40, it has been confirmed that the metal residue removability is further improved in a case where the content of the chloride ion is 0.001% to 5.00% by mass with respect to the total mass of the composition.

Through the comparison between Example 1 and the like and Examples 37 to 40, it has been confirmed that the metal residue removability is excellent in a case where the content of the chloride ion is 0.001% to 1.00% by mass with respect to the total mass of the composition.

Through the comparison between Examples 2, 3, 6 to 11, 15, 18, 21, 24, 26, 29 to 32, and 41 and Examples 4, 5, 23, 33, 35, 36, 40, and 42, it has been confirmed that the metal residue removability is further improved in a case where the mass ratio [(A)/(B)] of the content of the specific compound to the content of the chloride ion is 100 or less.

Through the comparison between Examples 1 to 4 and 23 to 26 and Examples 27 to 28, it has been confirmed that the effect of the present invention is further improved in a case where the pH of the composition is 4.0 to 14.0.

Through the comparison between Examples 2, 3, and the like and Examples 23 to 28, it has been confirmed that the solubility of Ru is further improved in a case where the pH of the composition is 7.0 to 12.0.

Through the comparison between Examples 1 to 9 and Examples 10 and 11, it has been confirmed that the effect of the present invention is further improved in a case where the specific compound includes at least one compound selected from the group consisting of an ethyltrimethylammonium salt, a diethyldimethylammonium salt, a methyltriethylammonium salt, a trimethyl(hydroxyethyl)ammonium salt, a methyltributylammonium salt, a dimethyldipropylammonium salt, a benzyltrimethylammonium salt, a benzyltriethylammonium salt, and a triethyl(hydroxyethyl)ammonium salt.

Through the comparison between Examples 2 and 3 and Examples 5 to 9, it has been confirmed that the effect of the present invention is further improved in a case where the specific compound includes at least one compound selected from the group consisting of an ethyltrimethylammonium salt, a diethyldimethylammonium salt, a methyltriethylammonium salt, and a trimethyl(hydroxyethyl)ammonium salt.

Through the comparison between Examples 1 to 9 and Examples 10 and 11, it has been confirmed that the effect of the present invention is further improved in a case where the alkyl groups represented by $R^1$ to $R^4$ have one to ten carbon atoms.

Furthermore, through the comparison between Examples 1 to 9 and Examples 10 and 11, it has been confirmed that the effect of the present invention is further improved in a case where $R^1$ to $R^4$ each represent an alkyl group selected from the group consisting of an alkyl group having one carbon atom which may have a substituent and an alkyl group having two carbon atoms which may have a substituent, at least one of $R^1$, $R^2$, $R^3$, or $R^4$ is an alkyl group having one carbon atom which may have a substituent, and at least one of $R^1$, $R^2$, $R^3$, or $R^4$ is an alkyl group having two carbon atoms which may have a substituent.

Through the comparison between Examples 1 to 4, 29 to 31, and 33 and Examples 32 and 34, it has been confirmed that the effect of the present invention is further improved in a case where the content of the oxohalogen acid compound is 0.05% to 28.0% by mass with respect to the total mass of the composition.

Through the comparison between Examples 1 to 10 and Example 11, it has been confirmed that the effect of the present invention is further improved in a case where the alkyl groups represented by $R^1$ to $R^4$ in Formula (1) have four to fifteen carbon atoms in total.

EXPLANATION OF REFERENCES

- **10*a***: wiring board before recess etching treatment of wiring
- **10*b***: wiring board after recess etching treatment of wiring
- 12: insulating film
- 14: barrier metal layer
- 16: Ru-containing wiring line
- 18: recess
- 20, 30: object to be treated
- 22: substrate
- 24: Ru-containing film
- 26: outer edge
- 32: substrate
- 34: Ru-containing film
- 36: etching stop layer
- 38: interlayer insulating film
- 40: metal hard mask
- 42: hole
- 44: interior wall
- **44*a***: cross-sectional wall
- **44*b***: bottom wall
- 46: dry etching residue

What is claimed is:

1. A composition comprising:

at least one oxohalogen acid compound selected from the group consisting of hypochlorous acid, chlorous acid, chloric acid, bromic acid, and salts thereof;

a compound represented by Formula (1), and a chloride ion, wherein a content of the compound represented by Formula (1) is 1.0% to 25.0% by mass with respect to a total mass of the composition, and a mass ratio of the content of the compound represented by Formula (1) to the content of the chloride ion is 10 or more and 100 or less, (1)

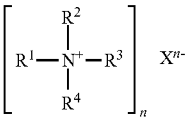

in Formula (1), $R^1$ to $R^4$ each independently represents an alkyl group which may have a substituent, $R^1$ to $R^4$ do not represent the same group all together, $X^{n-}$ represents an n-valent anion, and n represents an integer of 1 to 3, and the total number of carbon atoms in $R^1$ to $R^4$ is 4 to 15.

2. The composition according to claim 1,
wherein a content of the chloride ion is 0.001% to 1.00% by mass with respect to the total mass of the composition.

3. The composition according to claim 1,
wherein the number of carbon atoms in the alkyl group is 1 to 10.

4. The composition according to claim 1,
wherein n in Formula (1) is 1.

5. The composition according to claim 1,
wherein $X^{n-}$ in Formula (1) is a hydroxide ion, a chloride ion, a fluoride ion, or a bromide ion.

6. The composition according to claim 1,
wherein a content of the oxohalogen acid compound is 0.05% to 28.0% by mass with respect to the total mass of the composition.

7. The composition according to claim 1,
wherein a pH of the composition is 4.0 to 14.0.

8. The composition according to claim 1,
wherein a pH of the composition is 7.0 to 12.0.

9. The composition according to claim 1,
wherein the composition is used for removing a ruthenium-containing substance on a substrate.

10. A composition comprising:
at least one oxohalogen acid compound selected from the group consisting of hypochlorous acid, chlorous acid, chloric acid, bromic acid, and salts thereof;
a compound represented by Formula (1), and
a chloride ion,
wherein a content of the compound represented by Formula (1) is 1.0% to 25.0% by mass with respect to a total mass of the composition, and
a mass ratio of the content of the compound represented by Formula (1) to the content of the chloride ion is 10 or more and 100 or less,

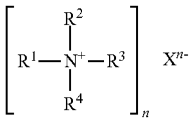
(1)

in Formula (1), $R^1$ to $R^4$ each independently represents an alkyl group which may have a substituent, $R^1$ to $R^4$ do not represent the same group all together, $X^{n-}$ represents an n-valent anion, and n represents an integer of 1 to 3,
where $R^1$ to $R^4$ each represents an alkyl group selected from the group consisting of an alkyl group having one carbon atom which may have a substituent and an alkyl group having two carbon atoms which may have a substituent,
at least one of $R^1$, $R^2$, $R^3$, or $R^4$ is an alkyl group having one carbon atom which may have a substituent, and
at least one of $R^1$, $R^2$, $R^3$, or $R^4$ is an alkyl group having two carbon atoms which may have a substituent.

11. A composition comprising:
at least one oxohalogen acid compound selected from the group consisting of hypochlorous acid, chlorous acid, chloric acid, bromic acid, and salts thereof;
a compound represented by Formula (1), and
a chloride ion,
wherein a content of the compound represented by Formula (1) is 1.0% to 25.0% by mass with respect to a total mass of the composition, and
a mass ratio of the content of the compound represented by Formula (1) to the content of the chloride ion is 10 or more and 100 or less,

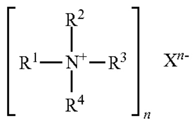
(1)

in Formula (1), $R^1$ to $R^4$ each independently represents an alkyl group which may have a substituent, $R^1$ to $R^4$ do not represent the same group all together, $X^{n-}$ represents an n-valent anion, and n represents an integer of 1 to 3,
wherein the compound represented by Formula (1) includes at least one compound selected from the group consisting of an ethyltrimethylammonium salt, a diethyldimethylammonium salt, a methyltriethylammonium salt, a trimethyl(hydroxyethyl) ammonium salt, a dimethylbis(2-hydroxyethyl) ammonium salt, a methyltris (2-hydroxyethyl) ammonium salt, a methyltributylammonium salt, a dimethyldipropylammonium salt, a benzyltrimethylammonium salt, a benzyltriethylammonium salt, and a triethyl(hydroxyethyl) ammonium salt.

12. A method for treating a substrate, comprising:
a step A of removing a ruthenium-containing substance on a substrate by using the composition according to claim 1.

13. The method for treating a substrate according to claim 12,
wherein the step A is a step A1 of performing a recess etching treatment on a wiring line which is disposed on a substrate and consists of a ruthenium-containing substance by using the composition, a step A2 of removing a film at an outer edge portion of a substrate, on which a film consisting of a ruthenium-containing substance is disposed, by using the composition, a step A3 of removing a metal-containing substance attached to a back surface of a substrate, on which a film consisting of a ruthenium-containing substance is disposed, by using the composition, a step A4 of removing a ruthenium-containing substance on a substrate, which has undergone dry etching, by using the composition, or a step A5 of removing a ruthenium-containing substance on a substrate, which has undergone a chemical mechanical polishing treatment, by using the composition.

* * * * *